(12) United States Patent
Akita

(10) Patent No.: US 10,448,505 B2
(45) Date of Patent: Oct. 15, 2019

(54) WIRING BOARD, METHOD FOR MANUFACTURING WIRING BOARD, AND METHOD FOR MANUFACTURING MULTI-PATTERN WIRING BOARD

(71) Applicant: NGK SPARK PLUG CO., LTD., Nagoya, Aichi (JP)

(72) Inventor: Kazushige Akita, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/108,451

(22) Filed: Aug. 22, 2018

(65) Prior Publication Data

US 2019/0069401 A1 Feb. 28, 2019

(30) Foreign Application Priority Data

Aug. 30, 2017 (JP) .................. 2017-166136

(51) Int. Cl.
| H05K 1/11 | (2006.01) |
| H05K 1/03 | (2006.01) |
| H05K 3/20 | (2006.01) |
| H05K 1/02 | (2006.01) |
| H05K 3/40 | (2006.01) |

(Continued)

(52) U.S. Cl.
CPC ......... *H05K 1/0306* (2013.01); *H05K 1/0298* (2013.01); *H05K 3/207* (2013.01); *H05K 3/403* (2013.01); *H01L 23/15* (2013.01); *H05K 3/0052* (2013.01); *H05K 3/4629* (2013.01); *H05K 2203/063* (2013.01)

(58) Field of Classification Search
CPC .... H05K 1/0306; H05K 1/0298; H05K 3/207; H05K 3/4629; H05K 1/117; H05K 2201/1059; H05K 3/403; H05K 3/0052; H01L 23/15; H02K 2203/063
USPC .......................................... 439/62
See application file for complete search history.

(56) References Cited

U.S. PATENT DOCUMENTS

| 5,110,298 A * | 5/1992 | Dorinski .............. H01L 24/10 439/55 |
| 2007/0155194 A1* | 7/2007 | Vega Martinez ...... H05K 1/142 439/62 |

(Continued)

FOREIGN PATENT DOCUMENTS

| JP | 2002-76623 A | 3/2002 |
| JP | 2007-027592 A | 2/2007 |
| JP | 2013-65793 A | 4/2013 |

*Primary Examiner* — Steven T Sawyer
(74) *Attorney, Agent, or Firm* — Stites & Harbison, PLLC; Jeffrey A. Haeberlin; James R. Hayne

(57) ABSTRACT

A wiring board includes recesses recessed to an inside of the wiring board, in a plan view, in portions connecting a far end surface to side surfaces, and an outer peripheral electroconductive layer disposed over a surface extending from the far end surface to the recesses. To electrically connect an electroconductive member to the outer peripheral electroconductive layer of the wiring board by, for example, joining such as soldering, the electroconductive member can be disposed in the recesses to be connected to the outer peripheral electroconductive layer. This structure prevents the electroconductive member from excessively protruding outward from the surface of the wiring board. Thus, a device having the wiring board installed therein can be made compact.

13 Claims, 13 Drawing Sheets

(51) Int. Cl.
*H05K 3/46* (2006.01)
*H01L 23/15* (2006.01)
*H05K 3/00* (2006.01)

(56) References Cited

U.S. PATENT DOCUMENTS

2014/0218954 A1* 8/2014 Yoon ..................... H01L 33/62
362/546
2015/0264811 A1* 9/2015 Inamori ................. H05K 1/117
174/254

* cited by examiner

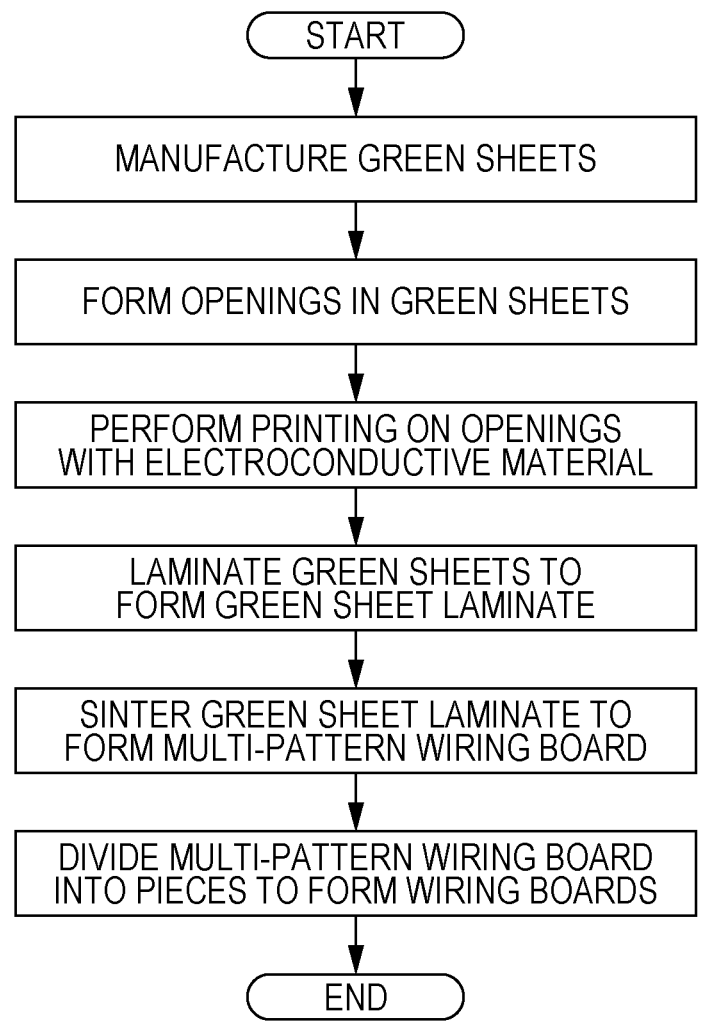

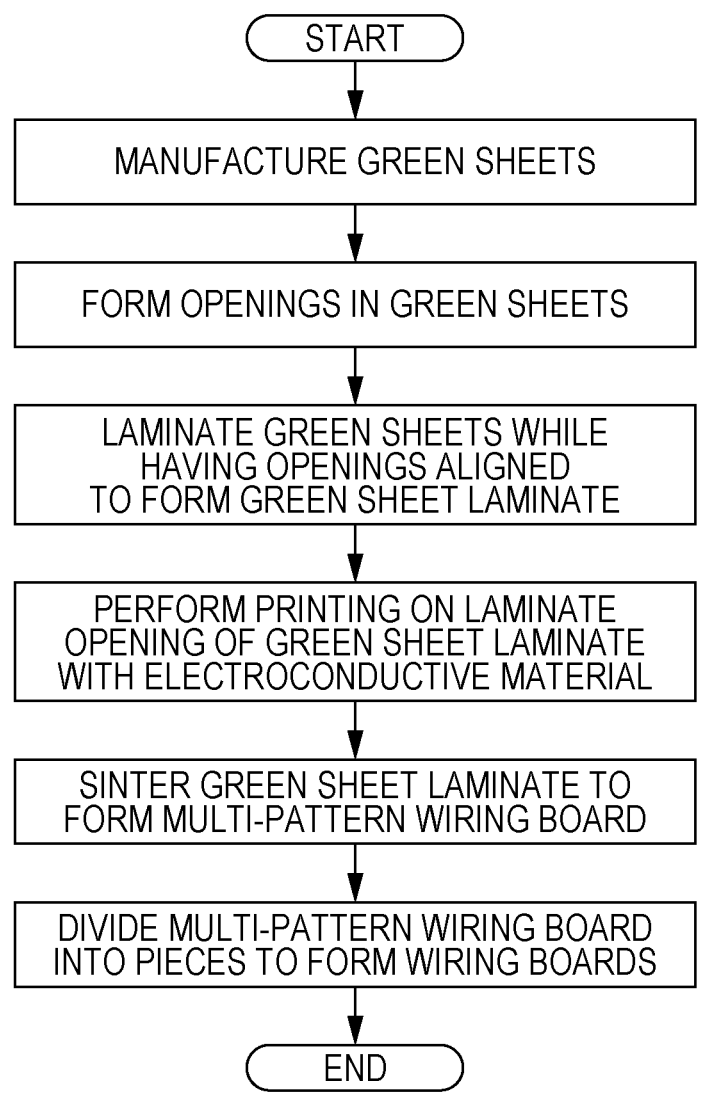

FIG. 13
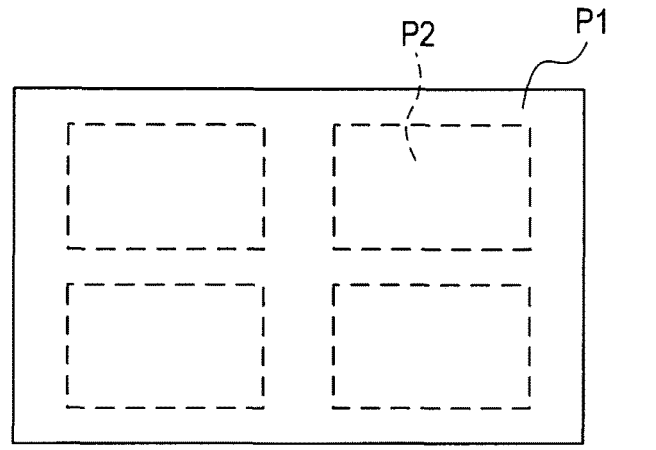
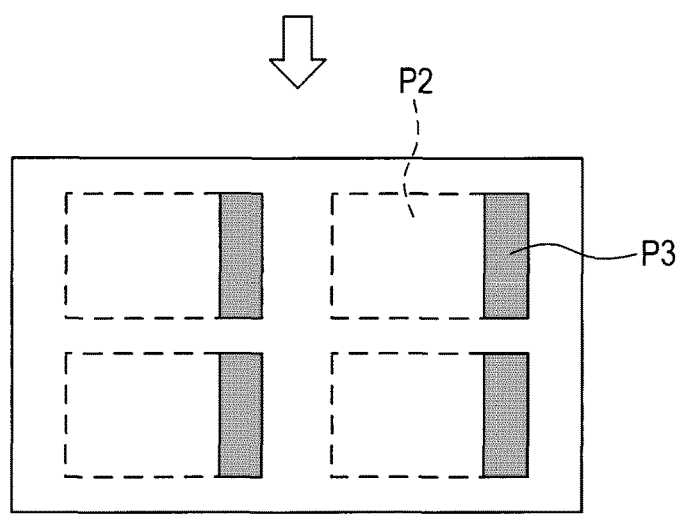
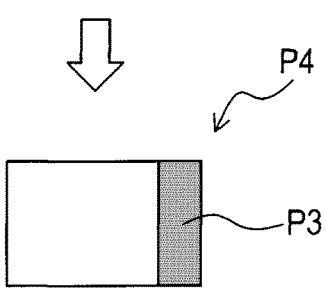
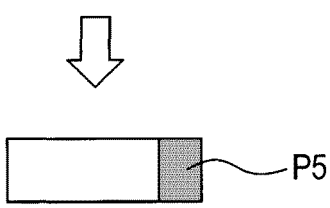

ical pattern can be formed by printing, such as screen printing, on the side surface of each piece. However, handling of a wiring board of, for example, 5 mm or smaller is difficult.

Specifically, forming an electroconductive pattern by printing on the side surface of a small piece is difficult. Thus, small-sized wiring boards having wirings on, for example, their side surfaces is difficult to mass-produce.

Existing pieces of small wiring boards are usually rectangular parallelepiped substrates. To join an electroconductive member such as a terminal to a wiring or another portion on the surface of each wiring board, the electroconductive member, which is larger than the outline of the wiring board, protrudes outward beyond the wiring board. Thus, an extra space is needed to dispose such a wiring board on a device or the like.

The present disclosure was made in view of the above problem, and aims to provide a wiring board that enables preferable connection to an electroconductive member, a method for manufacturing a small-sized mass-producible wiring board, and a method for manufacturing a multi-pattern wiring board usable for manufacturing the wiring board.

(1) A first aspect of the present disclosure is a wiring board including a pair of main surfaces arranged in a thickness direction, and an outer peripheral surface disposed along the outer peripheries of the pair of main surfaces between the pair of main surfaces.

The wiring board includes a far end surface, at ends of the main surfaces in one direction, and a pair of side surfaces disposed to hold the far end surface from two opposing sides of the far end surface in a plan view. The far end surface and the pair of side surfaces are included in the outer peripheral surface. In other words, the outer peripheral surface includes a far end surface at respective ends of the pair of main surfaces in a first direction, the far end surface including, in a plan view, two opposing sides, and a pair of side surfaces connecting, in the plan view, the two opposing sides of the far end surface. The wiring board also includes recesses (i.e., recessed surfaces) recessed to an inside of the wiring board in a plan view, in portions connecting the far end surface to the side surfaces or in the side surfaces. The wiring board also includes an outer peripheral electroconductive layer disposed over at least the far end surface and the surfaces of the recesses.

In the first aspect, the wiring board includes recesses recessed to an inside of the wiring board in a plan view, in portions connecting the far end surface to the side surfaces or in the side surfaces, and an outer peripheral electroconductive layer disposed over a surface extending from the far end surface to the recesses.

Thus, to electrically connect an electroconductive member such as a terminal to the outer peripheral electroconductive layer of the wiring board by, for example, joining such as soldering, the electroconductive member can be disposed in the recesses to be electrically connected to the outer peripheral electroconductive layer in the recesses. This structure prevents the electroconductive member from excessively protruding outward from the surface of the wiring board. Thus, a device having the wiring board installed therein can be made compact.

In a structure having recesses in portions connecting the far end surface to the side surfaces, the outer peripheral electroconductive layer can be disposed on the far end surface and the surfaces of the recesses. In a structure having recesses in the side surfaces, the outer peripheral electroconductive layer can be disposed at portions connecting the far end surface to the recesses.

WIRING BOARD, METHOD FOR MANUFACTURING WIRING BOARD, AND METHOD FOR MANUFACTURING MULTI-PATTERN WIRING BOARD

CROSS REFERENCE TO RELATED APPLICATIONS

The present application claims priority to Japanese Patent Application No. 2017-166136, which was filed on Aug. 30, 2017, the disclosure of which is herein incorporated by reference in its entirety.

BACKGROUND OF THE INVENTION

Field of the Invention

The present disclosure relates to a wiring board usable for, for example, a ceramic package, a method for manufacturing the wiring board, and a method for manufacturing a multi-pattern wiring board.

Description of the Related Art

Wiring boards (so-called ceramic wiring boards) having wirings installed inside and made of a ceramic material, such as alumina, have been manufactured to be included in, for example, a ceramic package (see PTL 1 to 3).

Such wiring boards have been manufactured by forming a single multi-pattern green sheet into multiple wiring boards, as illustrated in, for example, FIG. 13.

Specifically, a green sheet (so-called ceramic green sheet) P1 containing a ceramic material as a main component and a sintering agent as an additive is formed.

Subsequently, main-surface electroconductive patterns P3 are formed by screen printing in areas over which electroconductive layers for the surface or the main surface are formed. The areas are part of areas (that is, substrate mount portions enclosed by broken lines) P2 of the ceramic green sheet P1 corresponding to wiring boards. As appropriate, similar main-surface electroconductive patterns P3 are also formed on the back surface of the ceramic green sheet P1.

The ceramic green sheet P1 is cut into substrate mount portions P2, or pieces P4, which are formed into wiring boards after being sintered.

Subsequently, side-surface electroconductive patterns P5 are formed by, for example, screen printing on the side surfaces of the pieces P4.

Thereafter, the pieces P4 are sintered at a predetermined sintering temperature to form wiring boards, which are sintered bodies.

PATENT LITERATURE

PTL 1 is Japanese Unexamined Patent Application Publication No. 2002-76623.
PTL 2 is Japanese Unexamined Patent Application Publication No. 2007-27592.
PTL 3 is Japanese Unexamined Patent Application Publication No. 2013-65793.

BRIEF SUMMARY OF THE INVENTION

The above-described existing technology has the following problem, which requires improvement.

Specifically, for a large-sized wiring board, an electroconductive pattern can be formed by printing, such as screen (2) In a second aspect of the present disclosure, each of the pair of main surfaces may include a main-surface electroconductive layer electrically connected to the outer peripheral electroconductive layer over (at) the far end surface and the side surfaces.

In this structure, the electroconductive layer on the surface of the wiring board has a large area, and is more flexibly electrically connectable to the wiring board.

(3) In a third aspect of the present disclosure, the recesses may be formed in the portions connecting the far end surface to the side surfaces in the plan view, and the wiring board may include a rear end surface having a dimension larger than a dimension of the far end surface.

In the third aspect, the electroconductive member such as a terminal is disposed in the recesses formed in the portions connecting the far end surface to the side surfaces, and the electroconductive member is joined to the outer peripheral electroconductive layer in the recesses. Thus, the electroconductive member and the outer peripheral electroconductive layer can be reliably electrically connected together.

(4) In a fourth aspect of the present disclosure, the wiring board may also include a thinner-side electroconductive layer electrically connected to the outer peripheral electroconductive layer at a thin portion surrounded by the pair of recesses and the far end surface of the wiring board in a plan view, the thin portion having a thickness smaller than a thickness of an area of the wiring board opposite to the far end surface. In other words, the wiring board includes a thin portion surrounded by, in the plan view, the pair of recesses and the far end surface, the thin portion having a thickness smaller than a thickness of an area of the wiring board opposite to the far end surface, and a thinner-side electroconductive layer is electrically connected to the outer peripheral electroconductive layer at the thin portion.

In the fourth aspect, the area enclosed by the far end surface and the pair of recesses has a thickness smaller than the thickness of an area of the wiring board opposite to the far end surface. Thus, the electroconductive member such as a terminal can be disposed at the thin portion to be electrically connected to the thinner-side electroconductive layer. This structure thus prevents the electroconductive member from excessively protruding outward from the surface of the wiring board, and increases the flexibility of an arrangement of the electroconductive member.

(5) In a fifth aspect of the present disclosure, in a plan view, the pair of side surfaces may be parallel to each other and the far end surface is perpendicular to the side surfaces.

The fifth aspect exemplarily illustrates a preferable structure of a wiring board.

(6) A sixth aspect of the present disclosure is a method for manufacturing a multi-pattern wiring board used to manufacture a plurality of the wiring boards according any one of the first to fifth aspects.

The method for manufacturing a multi-pattern wiring board includes a step of forming openings in a green sheet at portions corresponding to the plurality of the wiring boards, each of the openings forming at least the far end surface and the recesses of one of the wiring boards after being sintered; a step of applying an electroconductive material to at least portions each forming the far end surface and the recesses by performing screen printing on the openings of the green sheet with the electroconductive material (i.e., screen printing the electroconductive material on the openings of the green sheet) while reducing a pressure on a surface of the green sheet opposite to a print surface during the screen printing; and a step of sintering the green sheet having the openings to which the electroconductive material is applied, or a laminate formed by laminating together a plurality of the green sheets having the openings aligned.

In the sixth aspect, an electroconductive material is applied to at least portions each forming the far end surface and the recesses when used to perform screen printing on the openings of the green sheet or laminate openings of the laminate of the green sheets while a pressure on a surface of the green sheet opposite to a print surface is reduced.

Thus, the electroconductive material is easily applicable to a portion that forms the far end surface and the recesses of each wiring board. Specifically, the electroconductive material is easily applicable to a portion to which the electroconductive material is difficult to apply, such as the openings of each green sheet or the laminate opening of the laminate of the green sheets.

Thus, use of such a multi-pattern wiring board facilitates manufacturing of a wiring board having a small size. Specifically, this method enables mass production of small wiring boards, which is significantly effective.

(7) A seventh aspect of the present disclosure is a method for manufacturing a multi-pattern wiring board used to manufacture a plurality of the wiring boards according any one of the first to fifth aspects.

The method for manufacturing a multi-pattern wiring board includes a step of forming openings in green sheets at portions corresponding to the plurality of the wiring boards, each of the openings forming at least the far end surface and the recesses of one of the wiring boards after being sintered; a step of forming a laminate of the green sheets by laminating the green sheets while having the openings aligned to form laminate openings; a step of applying an electroconductive material to at least portions each forming the far end surface and the recesses by performing screen printing, with the electroconductive material, on laminate openings of the laminate of the green sheets at each of which corresponding ones of the openings of the green sheets overlap each other (i.e., screen printing the electroconductive material on the laminate openings of the laminate of the green sheets) while reducing a pressure on a surface of the laminate opposite to a print surface during the screen printing; and a step of sintering the laminate of the green sheets to which the electroconductive material has been applied.

In the seventh aspect, an electroconductive material is applied to at least portions each forming the far end surface and the recesses when used to perform screen printing on laminate openings of the laminate of the green sheets at each of which corresponding ones of the openings of the green sheets overlap each other while a pressure on a surface of the laminate opposite to a print surface is reduced.

Thus, the electroconductive material is easily applicable to a portion that forms the far end surface and the recesses of each wiring board. Specifically, the electroconductive material is easily applicable to a portion to which the electroconductive material is difficult to apply, such as the laminate opening of the laminate of the green sheets.

Thus, use of such a multi-pattern wiring board facilitates manufacturing of a wiring board having a small size. Specifically, this method enables mass production of small wiring boards, which is significantly effective.

(8) An eighth aspect of the present disclosure is a method for manufacturing a plurality of the wiring boards according any one of the first to fifth aspects.

The method for manufacturing a plurality of the wiring boards includes a step of forming openings in a green sheet at portions corresponding to the plurality of the wiring boards, each of the openings forming at least the far end surface and the recesses of one of the wiring boards after being sintered; a step of applying an electroconductive material to at least portions each forming the far end surface and the recesses by performing screen printing on the openings of the green sheet with the electroconductive material (i.e., screen printing the electroconductive material on the openings of the green sheet) while reducing a pressure on a surface of the green sheet opposite to a print surface during the screen printing; and a step of dividing the green sheet having the opening to which the electroconductive material has been applied, or a laminate of a plurality of the green sheets formed by laminating the green sheets while having the openings aligned, into pieces corresponding to the wiring boards; and a step of sintering the divided pieces.

In the eighth aspect, an electroconductive material is applied to at least portions each forming the far end surface and the recesses when used to perform screen printing on the openings of the green sheet while reducing a pressure on a surface of the green sheet opposite to a print surface. Then, the green sheet having the opening to which the electroconductive material has been applied, or a laminate of a plurality of the green sheets formed by laminating the green sheets while having the openings aligned, is divided into pieces, and the divided pieces are sintered.

Thus, the electroconductive material is easily applicable to a portion that forms the far end surface and the recesses of each wiring board. Specifically, the electroconductive material is easily applicable to a portion to which the electroconductive material is difficult to apply, such as the openings of each green sheet.

Thus, a wiring board having a small size can be easily manufactured. Specifically, this method enables mass production of small wiring boards, which is significantly effective.

(9) A ninth aspect of the present disclosure is a method for manufacturing a plurality of the wiring boards according any one of the first to fifth aspects.

The method for manufacturing a plurality of the wiring boards includes a step of forming openings in green sheets at portions corresponding to the plurality of the wiring boards, each of the openings forming at least the far end surface and the recesses of one of the wiring boards after being sintered; a step of forming a laminate of the green sheets by laminating the green sheets while having the openings aligned to form laminate openings; a step of applying an electroconductive material to at least portions each forming the far end surface and the recesses by performing screen printing, with the electroconductive material, on laminate openings of the laminate of the green sheets at each of which corresponding ones of the openings of the green sheets overlap each other (i.e., screen printing the electroconductive material on the openings of the green sheet) while reducing a pressure on a surface of the laminate opposite to a print surface during the screen printing; a step of dividing the laminate of the green sheets to which the electroconductive material has been applied into pieces corresponding to the wiring boards; and a step of sintering the pieces.

In the ninth aspect, an electroconductive material is applied to at least portions each forming the far end surface and the recesses when used to perform screen printing on laminate openings of the laminate of the green sheets at each of which corresponding ones of the openings of the green sheets overlap each other while a pressure on a surface of the laminate opposite to a print surface is reduced.

Thus, the electroconductive material is easily applicable to a portion that forms the far end surface and the recesses of each wiring board. Specifically, the electroconductive material is easily applicable to a portion to which the electroconductive material is difficult to apply, such as the laminate opening of the laminate of the green sheets.

Thus, a wiring board having a small size can be easily manufactured. Specifically, this method enables mass production of small wiring boards, which is significantly effective.

In the present disclosure, the main surfaces refer to a first surface of a wiring board viewed in a thickness direction, and a flat surface opposite to the first surface.

The wording in a plan view refers to the view of the wiring board in the thickness direction.

Examples of a wiring board include a plate-shaped ceramic wiring board containing a ceramic material as a main component, and including electroconductive layers such as an outer peripheral electroconductive layer, a main-surface electroconductive layer, and a thinner-side electroconductive layer.

An example of such a wiring board is a small-sized wiring board. For example, the thickness falls within a range of 0.3 mm to 5.0 mm, and the maximum length in the flat direction (that is, thickness direction and vertical direction) falls within a range of 2.0 mm to 20.0 mm. When the wiring board is rectangular in a plan view, the length can be within a range of 2.0 mm to 20.0 mm, and the width can be within a range of 2.0 mm to 20.0 mm.

The maximum length of the recess from the side surface in a plan view can be within a range of 0.15 mm to 0.5 mm.

A green sheet refers to a sheet containing a ceramic material as a main component and not subjected to sintering. A green sheet laminate is a laminate of such green sheets in the thickness direction.

Examples of ceramic materials include alumina, aluminum nitride, and silicon nitride. Components other than ceramics may contain a known sintering agent or glass components. The ceramic material may be a low temperature co-fired ceramic (LTCC) or a middle temperature co-fired ceramic (MTCC).

Examples of an electroconductive material for the outer peripheral electroconductive layer, the main-surface electroconductive layer, and the thinner-side electroconductive layer include tungsten, molybdenum, copper, and silver.

BRIEF DESCRIPTION OF THE DRAWINGS

Illustrative aspects of the invention will be described in detail with reference to the following figures wherein:

FIG. 2A is a plan view of the wiring board, FIG. 2B is a front view of the wiring board, FIG. 2C is a bottom view of the wiring board, and FIG. 2D is a right side view of the wiring board.

FIG. 3 is a flowchart of steps of a method for manufacturing the wiring board according to the first embodiment.

FIG. 7 is a flowchart of steps of a method for manufacturing a wiring board according to a second embodiment.

FIG. 13 illustrates an existing technology.

DETAILED DESCRIPTION OF EXEMPLARY EMBODIMENTS OF THE INVENTION

Now, a wiring board, a method for manufacturing a wiring board, and a method for manufacturing a multi-pattern wiring board according to some embodiments of the present disclosure are described.

1. First Embodiment 1-1. Structure of Wiring Board

A wiring board according to a first embodiment is described, first.

Figure 1:
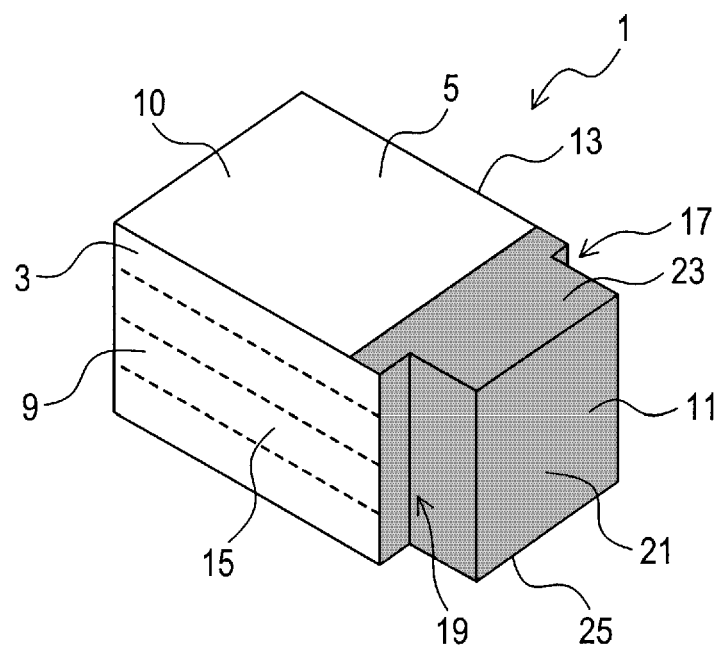
FIG. 1 is a perspective view of a wiring board according to a first embodiment.

As illustrated in FIG. 1, a wiring board 1 according to a first embodiment is a small-sized ceramic wiring board containing, for example, alumina as a main component (for example, 90 percent by weight or higher), and includes a ceramic substrate 10 having a laminate structure of multiple (for example, four) ceramic layers 3.

Figure 2A:
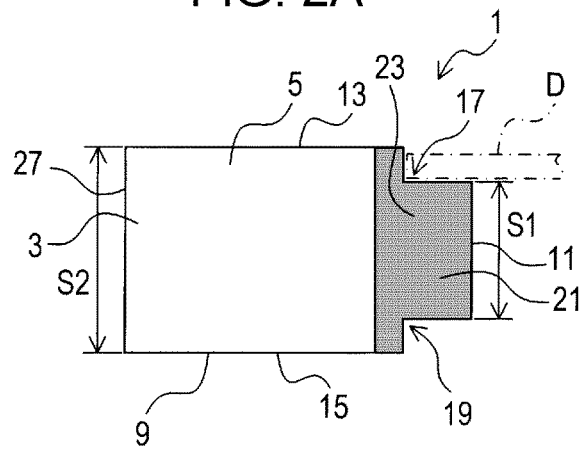
FIGS. 2A, 2B, 2C, and 2D illustrate the wiring board according to the first embodiment, where
Figure 2B:
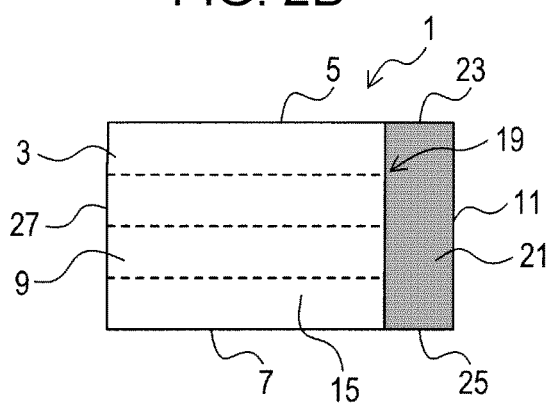
Figure 2D:
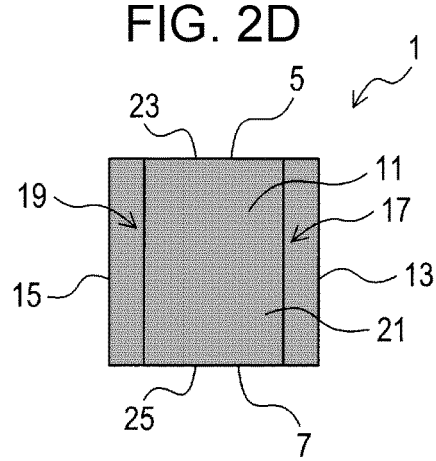
Figure 2C:
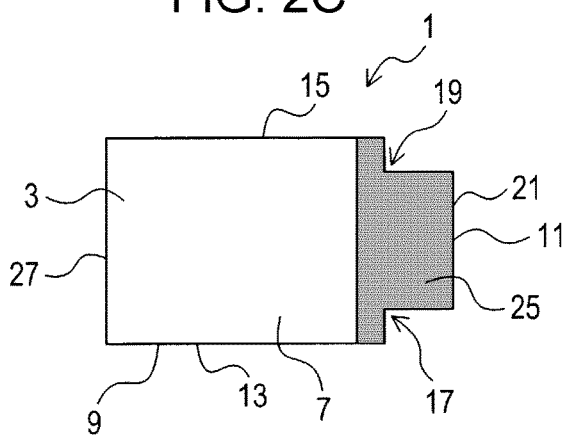

Specifically, as illustrated in FIGS. 2A, 2B, and 2C, the wiring board 1 is substantially rectangular parallelepiped, and includes a pair of main surfaces 5 and 7, arranged in the thickness direction (vertical direction in FIG. 2B), and a belt-like outer peripheral surface 9 extending along the outer peripheries of the pair of main surfaces 5 and 7 between the pair of main surfaces 5 and 7.

In a plan view (when viewed in the vertical direction in FIG. 2B), the wiring board 1 is, for example, 3.0 mm in the vertical direction and 5.0 mm in the lateral direction (at maximum), and has a thickness of, for example, 1.0 mm.

The outer peripheral surface 9 of the wiring board 1 (that is, the ceramic substrate 10) includes a far end surface 11 at an end in the direction parallel to the main surfaces 5 and 7 (on the right in FIG. 2A). The outer peripheral surface 9 also includes a pair of side surfaces 13 and 15, which connect to both sides (both sides in the vertical direction in FIG. 2A) of the far end surface 11, in a plan view. In a plan view, both side surfaces 13 and 15 are parallel to each other, and the far end surface 11 is perpendicular to both side surfaces 13 and 15.

At portions connecting the far end surface 11 to the side surfaces 13 and 15 (that is, at portions at which the far end surface 11 and the side surfaces 13 and 15 are adjacent to each other), recesses 17 and 19, which are corners recessed to an inside of the wiring board 1, are formed into, for example, an L shape in a plan view. These recesses 17 and 19 are recessed, for example, 0.15 mm from the side surfaces 13 and 15.

As illustrated in FIG. 2A, the recesses 17 and 19 are formed in the wiring board 1. Thus, in a plan view, the dimension S2 of a rear end surface 27 is larger than the dimension S1 of the far end surface 11.

The wiring board 1 also includes a single belt-shaped outer peripheral electroconductive layer 21, which covers the far end surface 11 and the entire surfaces of the recesses 17 and 19. The outer peripheral electroconductive layer 21 disposed on the surfaces of the recesses 17 and 19 forms a so-called castellation structure.

The wiring board 1 also includes main-surface electroconductive layers 23 and 25 at far end portions (on the right side in FIG. 2B) of the pair of main surfaces 5 and 7. These main-surface electroconductive layers 23 and 25 are electrically connected to the outer peripheral electroconductive layer 21, covering the far end surface 11 and the recesses 17 and 19.

Specifically, the main-surface electroconductive layers 23 and 25 protrude at the center in a plan view. The main-surface electroconductive layers 23 and 25 extend, in the front-rear direction (left-right direction in FIG. 2A), from the far end surface 11 to a portion slightly rearward of the recesses 17 and 19, and extend in the left-right direction (vertical direction in FIG. 2A) to be connected to the side surfaces 13 and 15.

Thus, the main-surface electroconductive layers 23 and 25 and the outer peripheral electroconductive layer 21 are continuously integrated and electrically connected together.

The outer peripheral electroconductive layer 21, and the main-surface electroconductive layers 23 and 25 are made of, for example, Mo or W.

1-2. Method for Manufacturing Wiring Board

Subsequently, a method for manufacturing the wiring board 1 is described with reference to FIG. 3 to FIG. 6B.

Steps for Manufacturing Green Sheets

First, alumina ($Al_2O_3$) powder is prepared as a main component, and powder of, for example, $SiO_2$, $MgCO_3$, and/or $BaCO_3$ is prepared as one or more sintering agent/agents.

A binder, a plasticizer, a solvent, and other components are added to these powder materials (one or more types of powder are selected as the sintering agent/agents) to form a ceramic slurry. In the powder materials, 90 percent by volume is alumina.

Figure 4A:
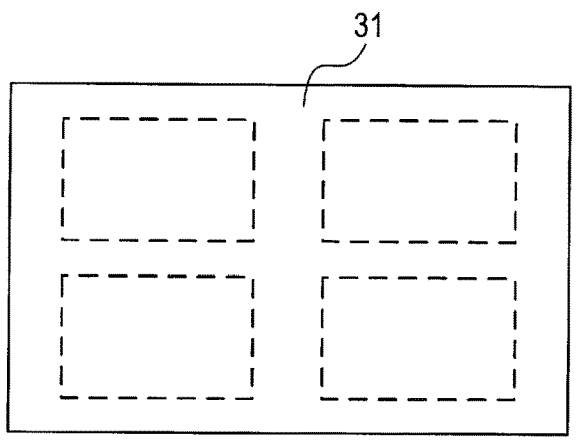
FIGS. 4A, 4B, 4C, and 4D illustrate a part of the method for manufacturing a wiring board according to the first embodiment.

Subsequently, as illustrated in FIG. 4A, the ceramic slurry is formed into a green sheet (that is, ceramic green sheet) 31 for a multi-pattern wiring board by doctor blade.

Step of Forming Openings

Subsequently, openings 33 are formed at portions of the green sheet 31 corresponding to the wiring boards 1 (portions enclosed in broken lines in FIG. 4A). Each opening 33 includes portions 11a, 17a, and 19a, which respectively form the far end surface 11 and the recesses 17 and 19 after being sintered.

Figure 4B:
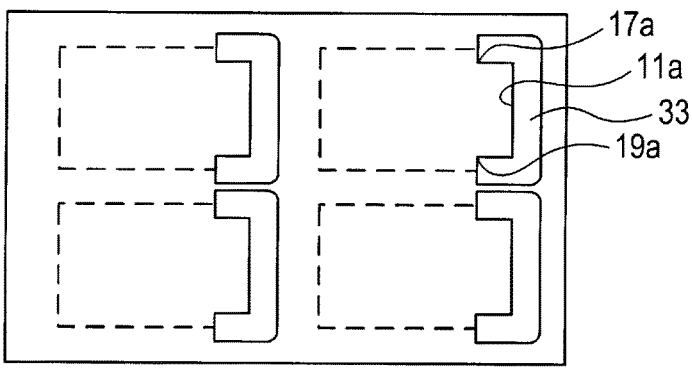

Specifically, as illustrated in FIG. 4B, portions of the green sheet 31 extending along part of the broken lines are punched out with a punch pin to form openings 33 at multiple portions (four portions in FIG. 4B), the punch pin having the same shape as each opening 33 in a plan view (substantially U shape). Instead of using a substantially U-shaped punch pin, a substantially U-shaped opening may be formed by punching out the green sheet 31 several times with a substantially rectangular punch pin.

Step of Printing with Electroconductive Material

First, powder materials such as Mo powder and $Al_2O_3$ powder are prepared as materials for the outer peripheral electroconductive layer 21 and the main-surface electroconductive layers 23 and 25.

A solvent and a binder component are added to these powder materials to adjust viscosity to manufacture an electroconductive material (that is, electroconductive paste or metallized ink) for the outer peripheral electroconductive layer 21 and the main-surface electroconductive layers 23 and 25. To manufacture the electroconductive paste, tungsten, which is an electroconductive component, is used as a main component.

Figure 4C:
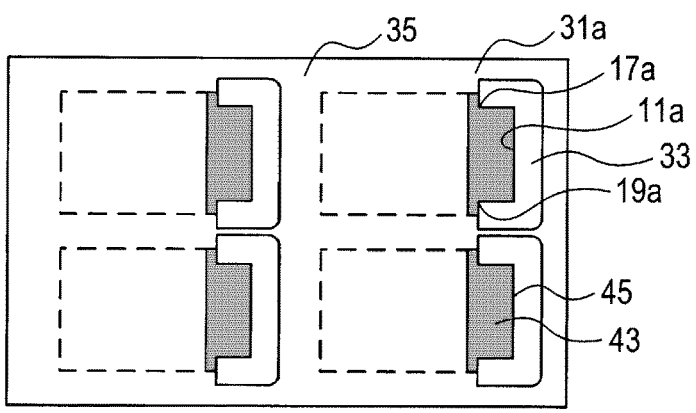

Subsequently, as illustrated in FIG. 4C, green sheets 31a (that is, outer green sheets 31a) are subjected to screen printing on both sides in the thickness direction of the wiring board 1 with an electroconductive paste at and around the openings 33.

In screen printing, the pressure of the surface opposite to a print surface 35 is reduced to apply the electroconductive paste to the portion 11a, forming the far end surface 11, and the portions 17a and 19a, forming the recesses 17 and 19.

Figure 6A:
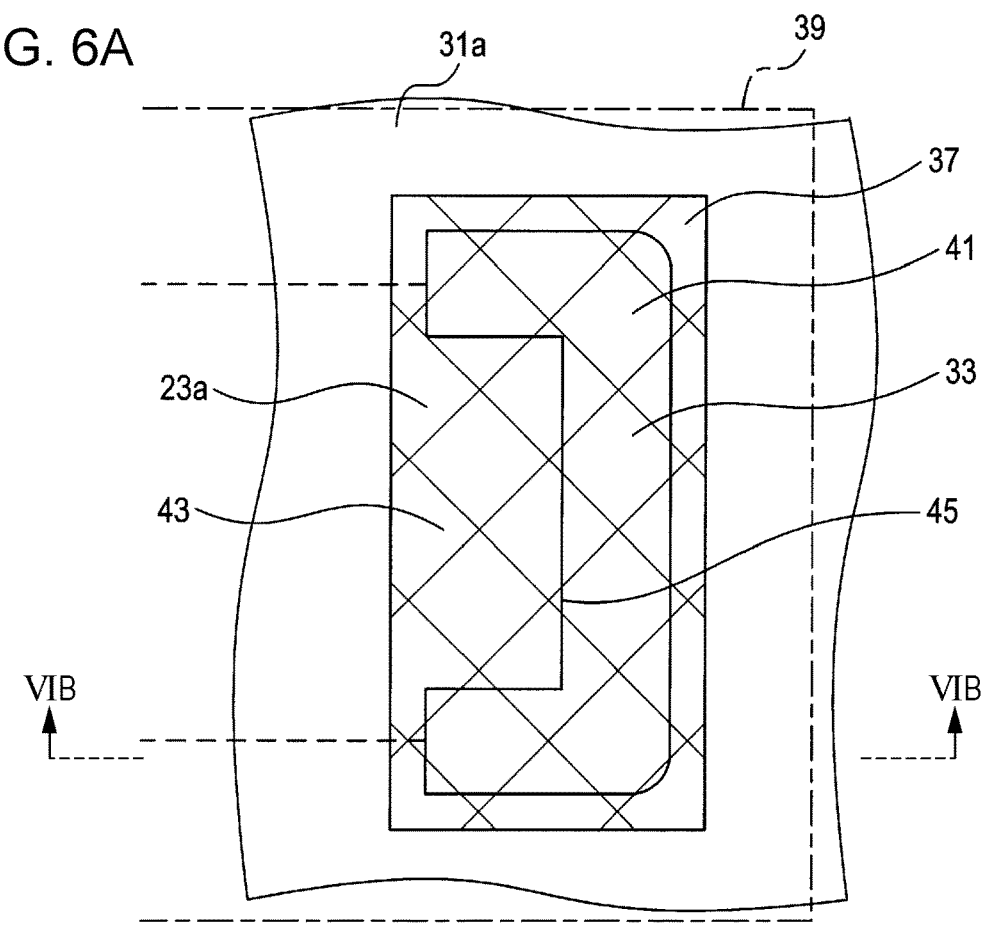
FIG. 6A illustrates a method for applying electroconductive paste to openings and other portions by screen printing, and FIG. 6B schematically illustrates the section taken along VIB-VIB in FIG. 6A.
Figure 6B:
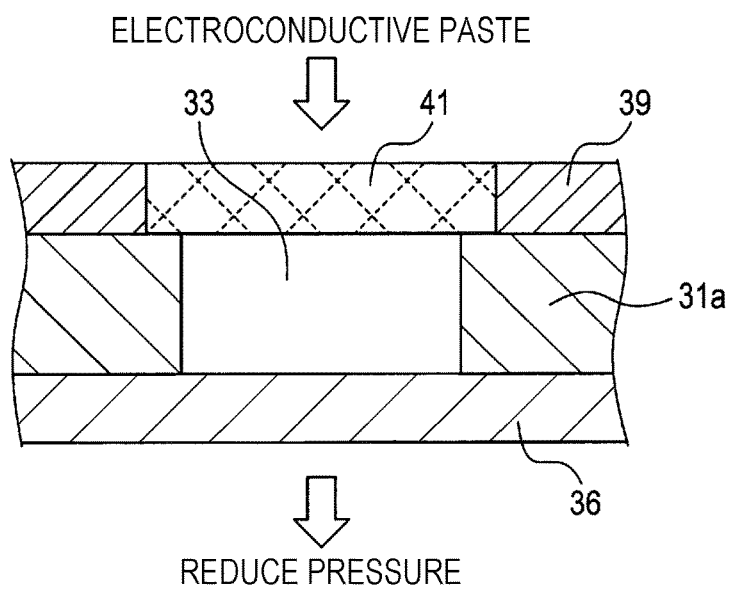

Specifically, as illustrated in FIG. 6B, one of the green sheets 31a is placed on a base 36, which is an air-permeable mesh.

As illustrated in FIG. 6A, a screen printing mask 39 is disposed on the surface of the green sheet 31a to cover, for example, a print portion (that is, double-hatched area in FIG. 6A) 37 including the opening 33 and a portion 23a, forming the main-surface electroconductive layer 23.

Specifically, the mask 39 has a print mesh portion 41 having a shape corresponding to the shape of a print portion 37 in a plan view, and through which the electroconductive paste can pass. The mask 39 is disposed to have the print mesh portion 41 coinciding the print portion 37.

As illustrated in FIG. 6B, the electroconductive paste is applied to an upper surface of the mask 39 (specifically, print mesh portion 41), and the lower surface of the base 36 (lower side in FIG. 6B) is subjected to pressure reduction. Pressure reduction here refers to reduce the pressure on the surface opposite to the surface to which the electroconductive paste is applied, further than that of the paste-applied surface.

Thus, the electroconductive paste passes through the print mesh portion 41, and flows toward the base 36 through the openings 33. Thus, the electroconductive paste adheres to the portion 23a, forming the main-surface electroconductive layer 23, and the inner peripheral surface of the opening 33. Specifically, the electroconductive paste forms a wiring pattern 43, serving as the main-surface electroconductive layer 23, and a wiring pattern 45, serving as the outer peripheral electroconductive layer 21 (see FIG. 4C).

Figure 4D:
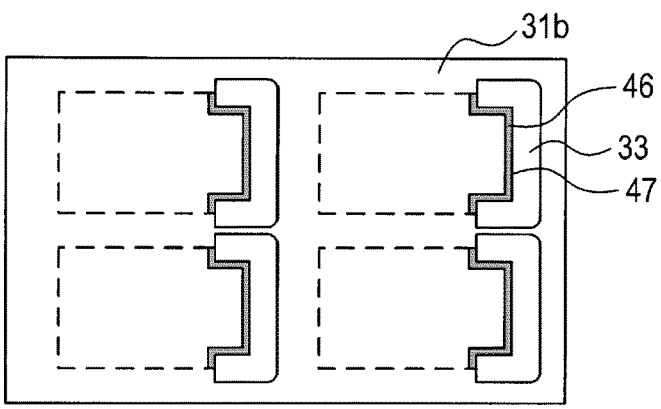

In addition, as illustrated in FIG. 4D, in the same manner as the above-described outer green sheet 31a, a pair of inner green sheets 31b interposed between the pair of outer green sheets 31a are subjected to screen printing. Specifically, the inner green sheets 31b are subjected to screen printing with the electroconductive paste and another mask 39 at or around the openings 33 of the green sheets 31b while having the opposite surfaces subjected to pressure reduction.

Specifically, a wiring pattern 46 on the surface of the green sheet 31b has a belt shape extending along the opening 33, and thus the mask 39 including the print mesh portion 41 corresponding to the opening 33 is used. A wiring pattern 47 formed in the opening 33 is similar to that of the outer green sheets 31a.

Step of Forming Laminate

Figure 5A:
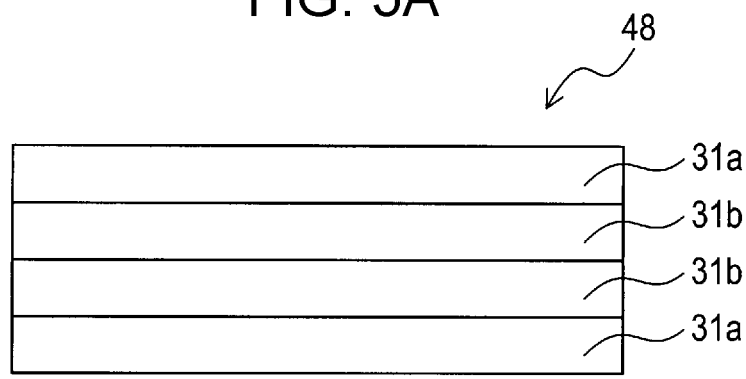
FIGS. 5A, 5B, and 5C illustrate another part of the method for manufacturing a wiring board according to the first embodiment.

Subsequently, as illustrated in FIG. 5A, the pair of outer green sheets 31a and the pair of inner green sheets 31b are laminated together to form a green sheet laminate 48.

Specifically, the pair of inner green sheets 31b are laminated to form the inner layers, and the outer green sheets 31a are laminated on the outer sides of the inner green sheets 31b.

Only on one surface of each of the outer green sheets 31a, the wiring pattern 43 serving as the main-surface electroconductive layer 23 or 25 is formed. The outer green sheets 31a are thus laminated to have the main-surface electroconductive layers 23 and 25 exposed to the outside in the lamination direction (vertical direction in FIG. 5A) (see FIG. 5B).

Figure 5B:
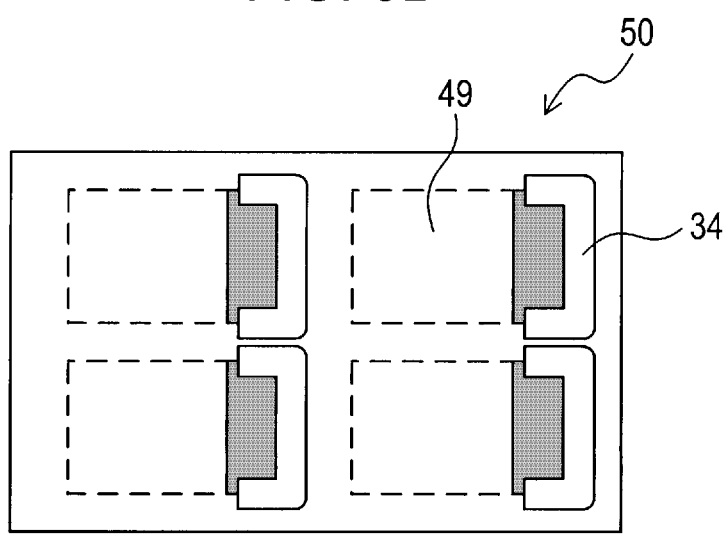

As illustrated in FIG. 5B, the green sheet laminate 48 includes laminate openings 34, formed by laminating the openings 33 of the green sheets 31.

Sintering Step

Subsequently, as illustrated in FIG. 5B, the green sheet laminate 48 is degreased and then sintered with predetermined sintering conditions, to form a multi-pattern wiring board 50 including portions (portions enclosed with broken lines) 49 corresponding to multiple wiring boards 1 and the openings 33.

The sintering conditions may be any conditions under reducing atmosphere and under which sintering is performed at higher than or equal to 1500° C.

Division Step

Figure 5C:
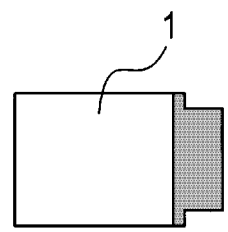

Subsequently, as illustrated in FIG. 5C, the multi-pattern wiring board 50 is cut with a cutting blade along the broken lines (specifically, divided into pieces) to form multiple wiring boards 1.

In the present embodiment, the green sheet laminate 48 is formed, sintered, and then divided into pieces. Instead, the wiring patterns 43, serving as the main-surface electroconductive layers 23 and 25, and the wiring pattern 45, serving as the outer peripheral electroconductive layer 21, may be similarly formed on a single green sheet 31, and the green sheet 31 may be sintered, and then divided into pieces.

1-3. Effects (1) The wiring board 1 according to the first embodiment includes the recesses 17 and 19, which are recessed to an inside of the wiring board 1 in a plan view, at portions connecting the far end surface 11 to the side surfaces 13 and 15 (that is, between the far end surface 11 and the side surfaces 13 and 15), and includes the outer peripheral electroconductive layer 21 on the surface extending from the far end surface 11 to the recesses 17 and 19.

To electrically connect the electroconductive members D (see FIG. 2A) such as terminals to the outer peripheral electroconductive layer 21 of the wiring board 1 by joining them together such as by soldering, the electroconductive members D are disposed in the recesses 17 and 19, so that the electroconductive members D can be connected to the outer peripheral electroconductive layers 21 in the recesses 17 and 19. This structure prevents the electroconductive members D from protruding outward from the surface of the wiring board 1. A device in which the wiring board 1 having this structure is installed can thus be made compact.

The main-surface electroconductive layers 23 and 25, which are electrically connected to the outer peripheral electroconductive layers 21 on the far end surface 11 and the side surfaces 13 and 15, are respectively disposed on the pair of main surfaces 5 and 7 of the wiring board 1.

Thus, the electroconductive layers on the surfaces of the wiring board 1 have large areas, which enhance the flexibility for electrical connection to the wiring board 1.

(2) In the method for manufacturing the wiring board 1 of the first embodiment, the green sheet 31 is subjected to screen printing with the electroconductive paste at and around the opening 33. In the screen printing, the surface opposite to the print surface 35 is subjected to pressure reduction to apply the electroconductive paste to the openings 33 and the portions serving as the main-surface electroconductive layers 23 and 25.

Thus, the electroconductive paste is easily applicable to narrow side surface portions of a small wiring board 1 (for example, portions formed into the far end surface 11 and the recesses 17 and 19). Specifically, the electroconductive paste is easily applicable to a portion to which the electroconductive paste is difficult to apply, such as the openings 33 of the green sheet 31.

With this method, the wiring board 1 having a small dimension can be easily manufactured. Specifically, small-sized wiring boards 1 can be easily mass-produced.

1-4. Correspondence Between Terms

Here, the correspondence between terms is described.

The main surfaces 5 and 7, the outer peripheral surface 9, the wiring board 1, the far end surface 11, the side surfaces 13 and 15, the recesses 17 and 19, the outer peripheral electroconductive layer 21, the main-surface electroconductive layers 23 and 25, the multi-pattern wiring board 50, the green sheet 31, the openings 33, the print surface 35, and the green sheet laminate 48 according to the first embodiment respectively correspond to examples of main surfaces, an outer peripheral surface, a wiring board, a far end surface, side surfaces, recesses, an outer peripheral electroconductive layer, main-surface electroconductive layers, a multi-pattern wiring board, a green sheet, openings, a print surface, and a green sheet laminate of the present disclosure.

2. Second Embodiment

Subsequently, a second embodiment is described. The contents that are the same as those of the first embodiment are omitted or simplified. Components the same as those of the first embodiment are denoted with the same reference signs.

The second embodiment mainly differs from the first embodiment in terms of a manufacturing method. Thus, the different points are mainly described with reference to FIG. 7.

Step of Manufacturing Green Sheets

In the same manner as in the first embodiment, a ceramic slurry is manufactured, and multiple green sheets 31 for a multi-pattern wiring board are manufactured by doctor blade from the ceramic slurry.

Step of Forming Openings

Subsequently, the openings 33 are formed in the respective green sheets 31 corresponding to the wiring boards 1. The step of forming the openings 33 is the same as that of the first embodiment.

Step of Forming Laminate

Subsequently, the green sheets 31 are laminated while having the openings 33 aligned to form the green sheet laminate 48. Here, the green sheet laminate 48 has no electroconductive paste applied thereto.

Step of Printing with Electroconductive Material

Subsequently, as in the case of the first embodiment, while having the opposite surface subjected to pressure reduction, the green sheet laminate 48 is subjected to screen printing using the mask 39 and the electroconductive paste at portions at which the openings 33 overlap (that is, laminate openings 34), and at portions 23a at which the main-surface electroconductive layers 23 are formed. Thus, the wiring patterns 43, serving as the main-surface electroconductive layers 23, and the wiring patterns 45, serving as the outer peripheral electroconductive layers 21, are formed.

Sintering Step

Subsequently, as in the case of the first embodiment, the green sheet laminate 48 to which the electroconductive paste has been applied is degreased, and sintered with predetermined sintering conditions to form a multi-pattern wiring board 50 including the openings 33 and the portions 49 corresponding to the multiple wiring boards 1.

Division Step

Subsequently, the multi-pattern wiring board 50 is cut with a dicer (that is, divided into pieces) to form multiple wiring boards 1. Before being sintered, the multi-pattern wiring board 50 may have brake grooves, extending along the outlines of the wiring board 1, formed by a cutting blade or a laser, and may be broken along the grooves into pieces after being sintered.

The second embodiment has the similar effects as the first embodiment.

3. Third Embodiment

Subsequently, a third embodiment is described. The contents that are the same as those of the first embodiment are omitted or simplified. Components the same as those of the first embodiment are denoted with the same reference signs.

Figure 8:
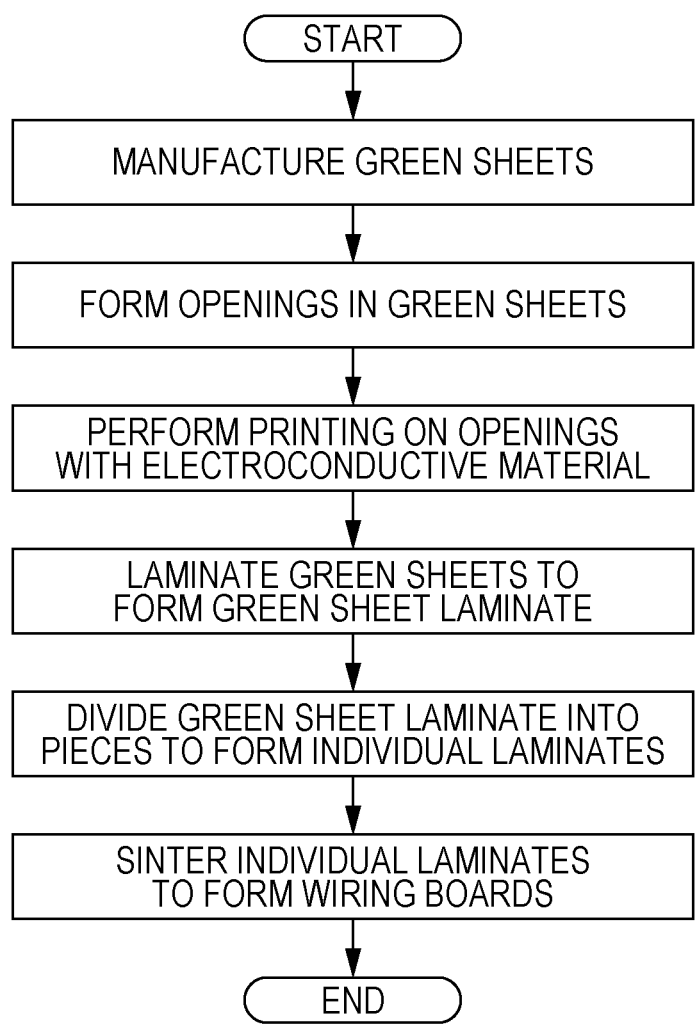
FIG. 8 is a flowchart of steps of a method for manufacturing a wiring board according to a third embodiment.

The third embodiment mainly differs from the first embodiment in terms of a manufacturing method. Thus, the different points are mainly described with reference to FIG. 8.

Step of Manufacturing Green Sheets

In the same manner as in the first embodiment, a ceramic slurry is manufactured, and multiple green sheets 31 for a multi-pattern wiring board are manufactured by doctor blade from the ceramic slurry.

Step of Forming Openings

Subsequently, the openings 33 are formed in the respective green sheets 31 corresponding to the wiring boards 1.

Step of Printing with Electroconductive Material

Subsequently, as in the case of the first embodiment, while having the opposite surface subjected to pressure reduction, each green sheet 31 is subjected to screen printing using the mask 39 and the electroconductive paste at and around the openings 33 (for example, at portions 23a at which the main-surface electroconductive layers 23 are formed). As in the case of the first embodiment, portions to which the electroconductive paste is applied differ between the outer green sheets 31a and the inner green sheets 31b.

Step of Forming Laminate

Subsequently, the green sheets 31 to which the electroconductive paste has been applied thereto are laminated while having the openings 33 aligned to form the green sheet laminate 48.

Division Step

Subsequently, the green sheet laminate 48 is cut with a cutting blade (that is, divided into pieces) to form multiple individual laminates (not shown) corresponding to the wiring boards 1.

Sintering Step

Subsequently, the individual laminates are degreased, and sintered with predetermined sintering conditions to form the multiple wiring boards 1.

Although the multi-pattern wiring board 50 is not manufactured in the third embodiment, the third embodiment has the same effects as those of the first embodiment.

4. Fourth Embodiment

Subsequently, a fourth embodiment is described. The contents that are the same as those of the first embodiment are omitted or simplified. Components the same as those of the first embodiment are denoted with the same reference signs.

Figure 9:
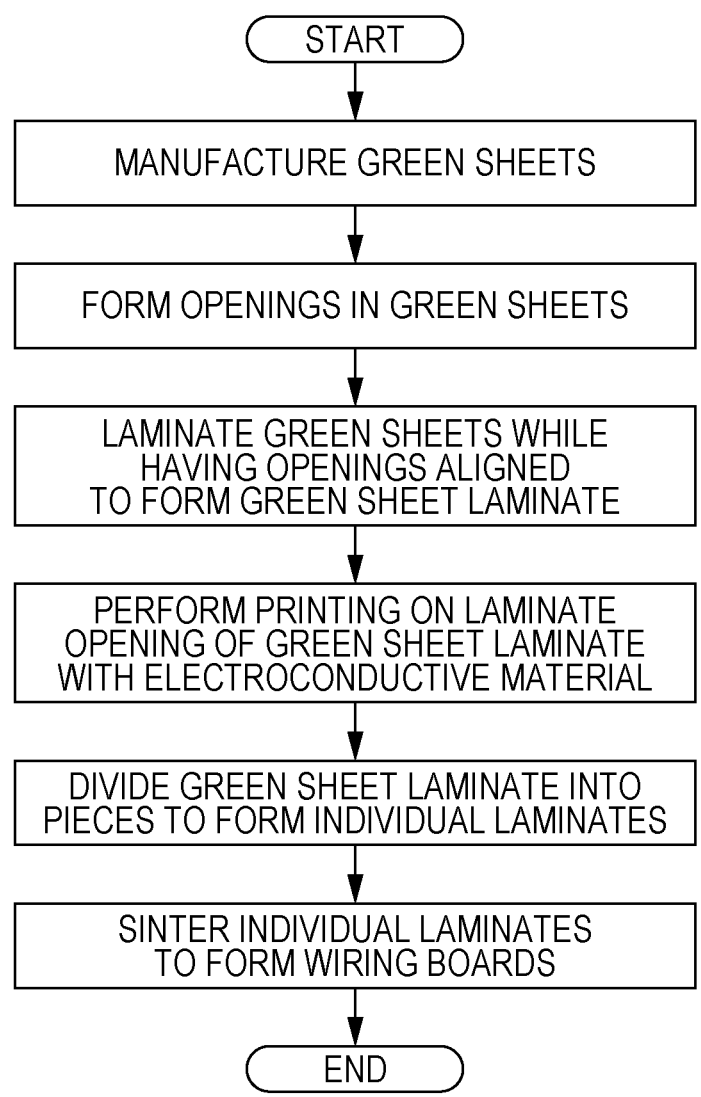
FIG. 9 is a flowchart of steps of a method for manufacturing a wiring board according to a fourth embodiment.

The fourth embodiment mainly differs from the first embodiment in terms of a manufacturing method. Thus, the different points are mainly described with reference to FIG. 9.

Step of Manufacturing Green Sheets

In the same manner as in the first embodiment, a ceramic slurry is manufactured, and multiple green sheets 31 for a multi-pattern wiring board are manufactured by doctor blade from the ceramic slurry.

Step of Forming Openings

Subsequently, the openings 33 are formed in the respective green sheets 31 corresponding to the wiring boards 1.

Step of Forming Laminate

Subsequently, the green sheets 31 are laminated while having the openings 33 aligned to form the green sheet laminate 48.

Step of Printing with Electroconductive Material

Subsequently, as in the case of the first embodiment, while having the opposite surface subjected to pressure reduction, the green sheet laminate 48 is subjected to screen printing using the mask 39 and the electroconductive paste at portions at which the openings 33 overlap (that is, laminate opening 34), and at portions 23a at which the main-surface electroconductive layers 23 are formed.

Division Step

Subsequently, the green sheet laminate 48 is cut with a cutting blade (that is, divided into pieces) to form multiple individual laminates (not illustrated) corresponding to the wiring boards 1.

Sintering Step

Subsequently, the individual laminates are degreased, and sintered with predetermined sintering conditions to form the multiple wiring boards 1.

The fourth embodiment has the similar effects as the first embodiment without manufacturing the multi-pattern wiring board 50.

5. Fifth Embodiment

Subsequently, a fifth embodiment is described. The contents that are the same as those of the first embodiment are omitted or simplified.

Figure 10:
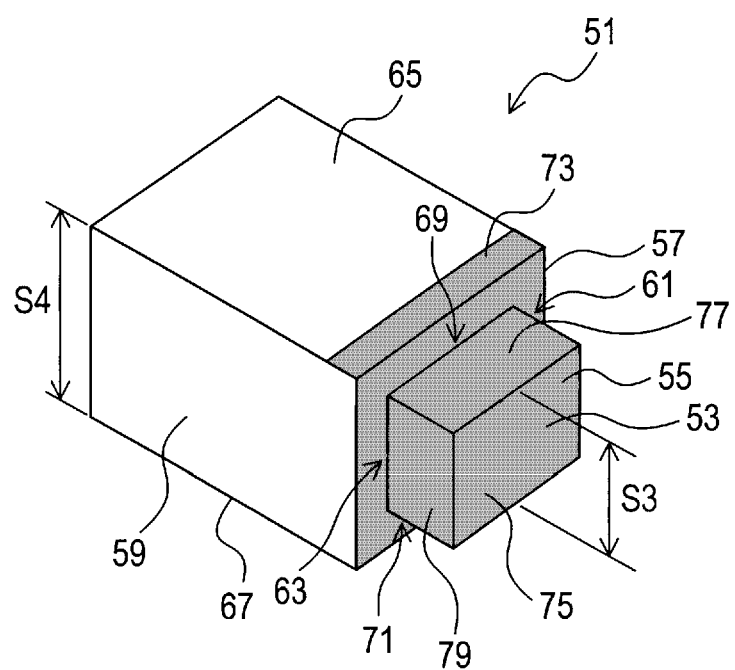
FIG. 10 is a perspective view of a wiring board according to a fifth embodiment.

As illustrated in FIG. 10, a wiring board 51 according to a fifth embodiment is substantially rectangular parallelepiped. At its far end portion (at a lower right portion in FIG. 10), the wiring board 51 has a rectangular parallelepiped protrusion 53, which protrudes from the far end portion.

As in the case of the first embodiment, recesses 61 and 63 are formed between a far end surface 55 of the protrusion 53 and both side surfaces 57 and 59 of the wiring board 51. In addition, recesses 69 and 71 are formed between the far end surface 55 of the protrusion 53 and both main surfaces 65 and 67 of the wiring board 51.

Thus, the thickness (thickness in the vertical direction of FIG. 10) S3 of the protrusion 53 is smaller than the thickness S4 of the portion opposite to the far end surface 55.

In addition, main-surface electroconductive layers 73 are formed at far end portions on the both main surfaces 65 and 67 of the wiring board 51. In addition, a far-end electroconductive layer 75 is formed over the entire surface of the far end portion of the wiring board 51. Specifically, the far-end electroconductive layer 75 is formed to cover the entire surface of the protrusion 53 and to cover the surrounding portions of the protrusion 53 in a square frame shape.

Of the far-end electroconductive layer 75, the electroconductive layers formed on a thin portion of the protrusion 53 are thinner-side electroconductive layers 77, and the electroconductive layers formed from the far end surface 55 to the recesses 61 and 63 are outer peripheral electroconductive layers 79.

The fifth embodiment has the same effects as those of the first embodiment. In the fifth embodiment, the recesses 61, 63, 69, and 71 are formed at four sides of the protrusion 53. Thus, when an electroconductive member D, such as a terminal, is connected to the far-end electroconductive layer 75 of the wiring board 1 without protruding from the outline, connection is highly flexibly performed with few limitations in terms of, for example, a connection direction.

6. Sixth to Eighth Embodiments

Subsequently, sixth to eighth embodiments are described. The contents that are the same as those of the first embodiment are omitted or simplified.

Figure 11A:
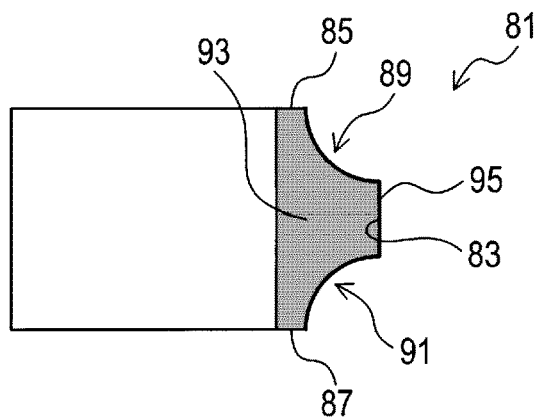
FIG. 11A is a plan view of a wiring board according to a sixth embodiment.

As illustrated in FIG. 11A, a wiring board 81 according to a sixth embodiment is substantially rectangular parallelepiped, and includes recesses 89 and 91, shaped in an arc (for example, a quarter of a circle) in a plan view, between a far end surface 83 and both side surfaces 85 and 87.

The wiring board 81 also includes main-surface electroconductive layers 93 on both sides of the wiring board 81 in the thickness direction (perpendicular to the plane of FIG. 11A). The wiring board 81 also includes an outer peripheral electroconductive layer 95, which covers the far end surface 83 and the surfaces of both recesses 89 and 91. The main-surface electroconductive layers 93 and the outer peripheral electroconductive layer 95 are continuously integrated and electrically connected together.

The sixth embodiment has the same effects as those of the first embodiment.

Figure 11B:
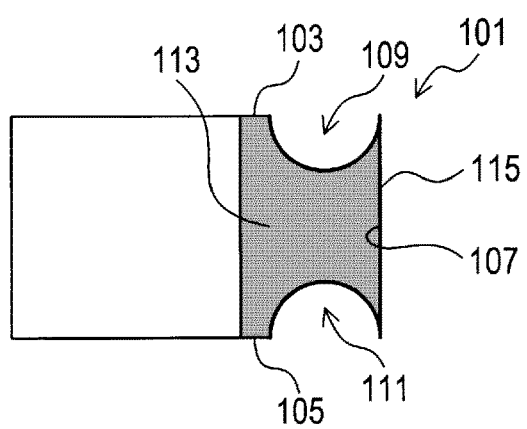
FIG. 11B is a plan view of a wiring board according to a seventh embodiment.

As illustrated in FIG. 11B, a wiring board 101 according to a seventh embodiment is substantially rectangular parallelepiped, and includes recesses 109 and 111, shaped in an arc (for example, semi-circular shape) in a plan view in the both side surfaces 103 and 105 at portions near a far end surface 107 (more specifically, reaching the far end surface 107).

The wiring board 101 includes main-surface electroconductive layers 113 formed on both sides of the wiring board 101 in the thickness direction (perpendicular to the plane of FIG. 11B). The wiring board 101 also includes an outer peripheral electroconductive layer 115, which continuously covers the far end surface 107 and the surfaces of the both recesses 109 and 111. The main-surface electroconductive layers 113 and the outer peripheral electroconductive layer 115 are continuously integrated and electrically connected together.

The seventh embodiment has the same effects as those of the first embodiment.

Figure 11C:
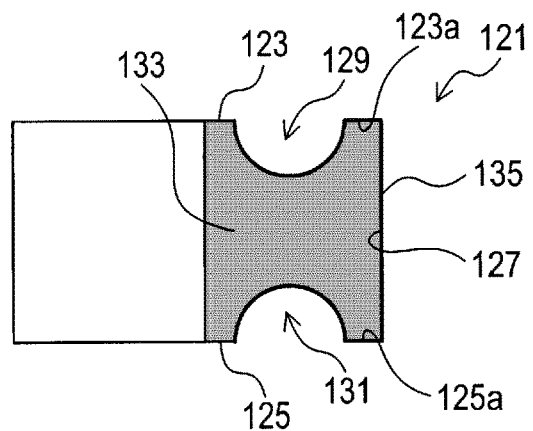
FIG. 11C is a plan view of a wiring board according to an eighth embodiment.

As illustrated in FIG. 11C, a wiring board 121 according to an eighth embodiment is substantially rectangular parallelepiped, and includes recesses 129 and 131, shaped in an arc (for example, semicircular shape) in a plan view, in the both side surfaces 123 and 125 at portions near a far end surface 127. The recesses 129 and 131 are spaced apart from the far end surface 127 by portions 123a and 125a of the side surfaces 123 and 125.

The wiring board 121 includes main-surface electroconductive layers 133 on both sides in the thickness direction (perpendicular to the plane of FIG. 11B). The wiring board 121 also includes an outer peripheral electroconductive layer 135, which continuously covers the area extending from the far end surface 127 to the surfaces of both recesses 129 and 131. The main-surface electroconductive layers 133 and the outer peripheral electroconductive layer 135 are continuously integrated and electrically connected together.

The eighth embodiment has the same effects as those of the first embodiment.

7. Other Embodiments

Thus far, the embodiments of the present disclosure have been described, but the present disclosure is not limited to the above embodiments, and can be embodied in various different forms within the range not departing from the gist of the present disclosure.

(1) For example, in the above embodiments, a wiring board including electroconductive layers on the surfaces of the ceramic substrate is described as an example, but the present disclosure is not limited to this structure.

Figure 12:
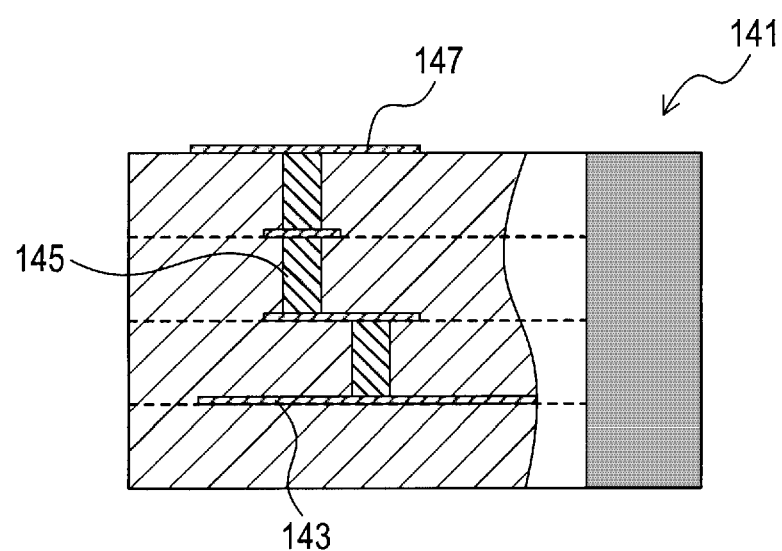
FIG. 12 is a front view of another wiring board partially broken in the thickness direction, including a section of the broken part.

For example, as exemplarily illustrated in FIG. 12, the present disclosure is naturally applicable to, for example, a wiring board (or, ceramic substrate) 141 including internal wiring layers 143 and vias 145 inside, and including a surface wiring layer 147, separate from the main-surface electroconductive layer, on the main surface of the wiring board.

A nickel-plated layer or nickel-gold-plated layer may be formed on the electroconductive layers on the surfaces of the wiring board for efficient connection between the wiring board and the electroconductive member D.

(2) The recesses may have any shape (for example, shape in a plan view), such as a perpendicularly cut L shape, an arc shape, a smooth curve, and a polygonal shape.

(3) Examples of a green sheet laminate formed by laminating multiple green sheets include various types of green sheet laminate including two or more layers. The present disclosure is, however, applicable to a single-layer green sheet.

(4) The materials for the green sheets such as ceramics and sintering agents, and the material for the electroconductive layers are not limited to those described in the embodiments, within the range of the present disclosure.

(5) The functions of one component in each of the embodiments may be shared by multiple components, or the functions of multiple components may be performed by one component. Some of the components in each embodiment may be omitted. At least one of the components in each embodiment may be added to or replaced with a component of another embodiment. Various forms included in the technical idea specified by the description of the scope of claims are said to be embodiments of the present disclosure.

What is claimed is:

1. A wiring board, comprising: a pair of main surfaces arranged in a thickness direction; an outer peripheral surface disposed along outer peripheries of the pair of main surfaces between the pair of main surfaces, the outer peripheral surface including: a far end surface at respective ends of the pair of main surfaces in a first direction, the far end surface including two opposing sides, and a pair of side surfaces respectively connected to the two opposing sides of the far end surface; a pair of recessed surfaces recessed to an inside of the wiring board in a plan view, the pair of recessed surfaces being formed in portions connecting the far end surface to the pair of side surfaces; an outer peripheral electroconductive layer disposed over the entirety of the far end surface and at least an area extending from the far end surface to the pair of recessed surfaces^ a rear end surface having a dimension larger than a dimension of the far end surface: a thin portion surrounded by, in the plan view, the pair of recessed surfaces and the far end surface, the thin portion having a thickness smaller than a thickness of an area of the wiring board opposite to the far end surface: and a thinner-side electroconductive layer electrically connected to the outer peripheral electroconductive layer at the tin portion; further comprising a main-surface electroconductive layer on each of the pair of main surfaces, the main-surface electroconductive layer being electrically connected to the outer peripheral electroconductive layer over the far end surface and the pair of recessed surfaces.

2. The wiring board according to claim 1, wherein, in the plan view, the pair of side surfaces are parallel to each other and the far end surface is perpendicular to the pair of side surfaces.

3. A method for manufacturing a multi-pattern wiring board used to manufacture a plurality of wiring boards according to claim 1, the method comprising:
   a step of forming openings in a green sheet at portions corresponding to the plurality of wiring boards, each of the openings forming at least the far end surface and the pair of recessed surfaces of one of the wiring boards after being sintered;
   a step of applying an electroconductive material to at least portions forming the far end surfaces and the pairs of recessed surfaces by screen printing the electroconductive material on the openings in the green sheet while reducing a pressure on a surface of the green sheet opposite to a print surface during the screen printing; and
   a step of sintering the green sheet having the openings to which the electroconductive material is applied, or a laminate formed by laminating together a plurality of the green sheets having the openings aligned.

4. A method for manufacturing a multi-pattern wiring board used to manufacture a plurality of wiring boards according to claim 1, the method comprising:
   a step of forming openings in green sheets at portions corresponding to the plurality of wiring boards, each of the openings forming at least the far end surface and the pair of recessed surfaces of one of the wiring boards after being sintered;
   a step of forming a laminate of the green sheets by laminating the green sheets while having the openings aligned to form laminate openings;
   a step of applying an electroconductive material to at least portions forming the far end surfaces and the pairs of recessed surfaces by screen printing the electroconductive material on the laminate openings in the laminate of the green sheets while reducing a pressure on a surface of the laminate opposite to a print surface during the screen printing; and
   a step of sintering the laminate of the green sheets to which the electroconductive material has been applied.

5. A method for manufacturing a plurality of wiring boards according to claim 1, the method comprising:
   a step of forming openings in a green sheet at portions corresponding to the plurality of wiring boards, each of the openings forming at least the far end surface and the pair of recessed surfaces of one of the wiring boards after being sintered;
   a step of applying an electroconductive material to at least portions forming the far end surfaces and the pairs of recessed surfaces by screen printing the electroconductive material on the openings in the green sheet while reducing a pressure on a surface of the green sheet opposite to a print surface during the screen printing; and a step of dividing the green sheet having the openings to which the electroconductive material has been applied, or a laminate of a plurality of the green sheets formed by laminating the green sheets while having the openings aligned, into pieces corresponding to the wiring boards; and a step of sintering the pieces.

6. A method for manufacturing a plurality of wiring boards according to claim 1, the method comprising:

a step of forming openings in green sheets at portions corresponding to the plurality of the wiring boards, each of the openings forming at least the far end surface and the pair of recessed surfaces of one of the wiring boards after being sintered;

a step of forming a laminate of the green sheets by laminating the green sheets while having the openings aligned to form laminate openings;

a step of applying an electroconductive material to at least portions forming the far end surfaces and the pairs of recessed surfaces by screen printing the electroconductive material on the laminate openings in the laminate of the green sheets while reducing a pressure on a surface of the laminate opposite to a print surface during the screen printing;

a step of dividing the laminate of the green sheets to which the electroconductive material has been applied into pieces corresponding to the wiring boards; and a step of sintering the pieces.

7. A wiring board, comprising:

a pair of main surfaces arranged in a thickness direction;

an outer peripheral surface disposed along outer peripheries of the pair of main surfaces between the pair of main surfaces, the outer peripheral surface including:

a far end surface at respective ends of the pair of main surfaces in a first direction, the far end surface including two opposing sides, and a pair of side surfaces respectively connected to the two opposing sides of the far end surface;

a pair of recessed surfaces recessed to an inside of the wiring board in a plan view, the pair of recessed surfaces being formed in portions connecting the far end surface to the pair of side surfaces or in the pair of side surfaces, the pair of recessed surfaces shaped in an arc; and an outer peripheral electroconductive layer disposed over the entirety of the far end surface and at least an area extending from the far end surface to the pair of recessed surfaces.

8. The wiring board according to claim 7, wherein, in plan view, the pair of recessed surfaces are shaped in an arc between the far end surface and the pair of side surfaces.

9. The wiring board according to claim 8, wherein, in plan view, the pair of recessed surfaces are in a quarter circle shape.

10. The wiring board according to claim 7, wherein, in plan view, the pair of recessed surfaces are shaped in the pair of side surfaces at a portion immediately adjacent to the far end surface.

11. The wiring board according to claim 10, wherein, in plan view, the pair of recessed surfaces are in a semi-circular shape.

12. The wiring board according to claim 7, wherein, in plan view, the pair of recessed surfaces are shaped in the pair of side surfaces at a portion spaced apart from the far end surface.

13. The wiring board according to claim 12, wherein, in plan view, the pair of recessed surfaces are in a semi-circular shape.

* * * * *

UNITED STATES PATENT AND TRADEMARK OFFICE
CERTIFICATE OF CORRECTION

PATENT NO. : 10,448,505 B2  
APPLICATION NO. : 16/108451  
DATED : October 15, 2019  
INVENTOR(S) : Kazushige Akita Page 1 of 1

It is certified that error appears in the above-identified patent and that said Letters Patent is hereby corrected as shown below:

In the Claims

Claim 1, Column 15, Line 67, replace "surfaces^" with "surfaces;"

Claim 1, Column 16, Line 7, replace "layer at the tin" with "layer at the thin"

Signed and Sealed this  
Twenty-sixth Day of November, 2019

Andrei Iancu  
*Director of the United States Patent and Trademark Office*